United States Patent
Veil et al.

(10) Patent No.: US 7,187,091 B2
(45) Date of Patent: Mar. 6, 2007

(54) SAFETY SWITCHING MODULE AND METHOD FOR TESTING THE SWITCHING-OFF ABILITY OF A SWITCHING ELEMENT IN A SAFETY SWITCHING MODULE

(75) Inventors: Richard Veil, Stuttgart (DE); Jürgen Fleiner, Reutlingen (DE)

(73) Assignee: Pilz GmbH & Co., Ostfildern (DE)

( * ) Notice: Subject to any disclaimer, the term of this patent is extended or adjusted under 35 U.S.C. 154(b) by 298 days.

(21) Appl. No.: 10/717,785

(22) Filed: Nov. 20, 2003

(65) Prior Publication Data

US 2004/0160131 A1  Aug. 19, 2004

Related U.S. Application Data

(63) Continuation of application No. PCT/EP02/02840, filed on Mar. 14, 2002.

(30) Foreign Application Priority Data

May 22, 2001 (DE) .............................. 101 27 233

(51) Int. Cl.
*H02H 11/00* (2006.01)
(52) U.S. Cl. ..................................... 307/326
(58) Field of Classification Search ................. 307/326
See application file for complete search history.

(56) References Cited

U.S. PATENT DOCUMENTS 5,381,296 A    1/1995  Ekelund et al.
5,777,834 A *  7/1998  Lehner et al. ................. 361/66
6,507,468 B1 * 1/2003  Klattenhoff et al. .......... 361/54

FOREIGN PATENT DOCUMENTS

DE    37 32 079 A1    4/1989
DE    42 24 620 C1    3/1994
DE    100 11 211 A1   9/2001

* cited by examiner

*Primary Examiner*—Robert L. DeBeradinis
(74) *Attorney, Agent, or Firm*—Harness, Dickey & Pierce, P.L.C.

(57) ABSTRACT

A safety switching module for safely switching-off an electrical load (43), comprising a first and a second switching control device (20A, 20B); a first and a second switching element (24.1, 24.2) both being series-connected with each other and forming a first current path (26.1) for supplying the load, whereby the first switching element (24.1) can be controlled by the first switching control device (20A) and the second switching element (24.2) can be controlled by the second switching control device (20B); and an evaluation and control device (12) for testing the switching-off ability of at least one switching element. A third and a fourth switching element (24.3, 24.4) are provided which are connected to each other in series, are connected in parallel to the series connection consisting of the first and second switching elements (24.1, 24.2) and form a second current path (26.2), the third switching element (24.3) being controlled by the first switching control device (20A) and the fourth switching element (24.4) being controlled by the second switching control device (20B). Further, the evaluation and control device (12) carries out the test of the switching elements by alternating in one of both current paths (26.1, 26.2) so that the other of both current paths supplies the load (43).

17 Claims, 3 Drawing Sheets

SAFETY SWITCHING MODULE AND METHOD FOR TESTING THE SWITCHING-OFF ABILITY OF A SWITCHING ELEMENT IN A SAFETY SWITCHING MODULE

CROSS REFERENCES TO RELATED APPLICATIONS

This application is a continuation of copending international application PCT/EP02/02840 filed on Mar. 14, 2002 designating the U.S. and published in German language on Nov. 28, 2002. The international application claims priority of German patent application DE 101 27 233.2 filed on May 22, 2001.

BACKGROUND OF THE INVENTION

The present invention relates to a safety switching module for safely switching-off an electrical load, comprising a first and a second switching control device, a first and a second switching element, both being series-connected with each other and forming a first current path for supplying the load, whereby the first switching element can be controlled by the first switching control device and the second switching element can be controlled by the second switching control device, and an evaluation and control device for testing the switching-off ability of at least one switching element. The present invention further relates to a method for testing the switching-off ability of a switching element in such a safety switching module.

Such safety switching modules and safety switching devices, respectively, are generally known. For example, the applicant offers safety switching devices of different types under the name "PNOZ". In the patent application DE 100 11 211, the applicant has disclosed such a safety switching device, for example.

In general, such safety switching devices are particularly used in the industrial field as to switch on and safely switch off electrically driven machines, like a stamping press or a milling cutter, a valve block for pneumatic or hydraulic control systems or output models of an SPS. Particularly in connection with a mechanically-operated emergency stop push button they serve to switch off the machine in an emergency situation quickly and safely. For this purpose, the energy supply of the machine to be switched off is coupled via two switching elements connected in series. As soon as just one of both switching elements opens, the energy supply to the machine is interrupted.

In order to carry out a test of the switching ability of the switching element during operation of such a safety switching device, an evaluation and control unit is provided which switches off each single switching element briefly and which thereby detects and evaluates the output signal (back-read-out signal) of the switching elements. On the basis of this evaluation, the evaluation and control unit is able to determine whether each switching element has the ability to interrupt the electrical supply of the machine, i.e. in general the electrical load, in an emergency situation. In order not to effect the electrical load during this test procedure, the switching element is switched off just for a very brief time period which is not "viewable" for the load.

Due to the mechanical inertia of the electromechanical switching elements, this test procedure is possible only for electronic switching elements on the basis of semiconductor devices. If, however, the current to be switched by the switching element exceeds a predetermined value (typically about 8 ampere) and the electrical load is not a pure ohmic load (capacitive and inductive components), the above-mentioned test procedure consisting of the brief switching-off of the switching elements is only possible with a large additional effort. For evaluating the output signals of the switching elements, the load would have to be discharged in this case as to keep the switching-off pulse small. The brief discharge of a larger capacitor would require a very large discharge current. For example, to discharge a 1 mF capacitor in a time period of 200 μs by 25 V, a discharge current of 125 A would be necessary.

SUMMARY OF THE INVENTION

In view of the above, the object of the present invention is to provide a safety switching module of the aforementioned kind which allows a test of the switching-off ability of the switching elements in a simple manner also with large currents to be switched and/or capacitive or inductive loads.

This object is solved by the safety switching module of the aforementioned kind in that a third and a fourth switching element are provided which are connected to each other in series, are connected in parallel to the series connection consisting of said first and second switching elements, and form a second current path, the third switching element being controlled by the first switching control device and the fourth switching element being controlled by the second switching control device; and that the evaluation and control device carries out the test of the switching elements alternating in one of both current paths so that the other of both current paths supplies the load.

That is with other words that in addition to the present current path which may be switched currentless by both switching elements, a further current path is provided in parallel having two further switching elements. In normal operation the load is energized via both current paths. During a test cycle, the switching-off ability of one of both current paths is tested while the other current patch then takes over the electrical supply soleley.

Hence it is possible to still carry out a test of the switching-off ability by briefly switching-off the switching elements and by back-reading out output signals of these switching elements without impeding the supply of the electrical load. As a result, a safety switching module for safely switching-off large currents as well may be constructed with simple means.

Since the switching-off pulse does not reach the load, longer switching-off pulses are possible. I.e. that the arrangement according to the present invention allows to test semiconductor devices as well as electromechanical switching elements while the load is switched on.

A further advantage of the inventive arrangement is that the energy supply safety is increased since a safe supply of the load is possible even if one current path breaks down due to a short-circuited semiconductor device in response to a respective driving signal.

In a preferred embodiment of the invention, the first and the second switching element are provided as semiconductor switching elements. Preferably, the second and the fourth switching elements are electromechanical switching elements, preferably relays.

These measures have the advantage that, for example, the relay contacts need not switch the current in normal operation since the semiconductor switching element switches faster and has already switched off the current. This allows to take care of the relay contacts and to increase their operating life significantly. Due to the use of diversitary redundant switching elements (semiconductor and relay), failures in both switching elements caused by the same reasons, e.g. by a disturbing pulse with high energy, may be excluded. Of course it is also possible that all four switching elements are provided equally as semiconductor switching elements, AC current switching semiconductor switching elements, preferably photo-MOS-relays or relays.

In a preferred embodiment, the switching control device is provided as a dual-channel switching control device.

This measure has the advantage that the safety of the safety switching module may be further increased.

In a preferred embodiment, the evaluation and control device is connected with each of both current paths such that they may readout a signal between the first and the second switching element and the third and the fourth switching element, respectively.

This measure has the advantage that the evaluation and control device is able to detect the switching-off ability of both switching elements in the respective current path.

In a preferred embodiment, the evaluation and control device is provided such that it generates a short switching-off pulse and supplies it either to the first or to the third switching element as to switch off this element shortly. Preferably, this switching-off pulse is modulated on the control signal generated by the switching control device.

This measure has the advantage that a very simple arrangement for testing the switching-off ability is possible.

The object underlying the present invention is also solved by a method for testing the switching-off ability of a switching element in a safety switching module which serves to safely switch off an electric load, and which comprises the steps: providing a first current path for energizing the load, said first current path comprising a switching element for safely switching-off, providing a second current path in parallel to the first current path for energizing the load, the second current path comprising at least one switching element, and alternately testing the switching-off ability of one of both current paths, the other current path not being tested solely energizing said load during this test phase.

This method for testing the switching-off ability has the same advantages as mentioned above, so that it is refrained from describing them again.

It is to be understood that the features mentioned above and those yet to be explained below can be used not only in the respective combinations indicated, but also in other combinations or in isolation, without leaving the scope of the present invention.

BRIEF DESCRIPTION OF THE DRAWINGS

Embodiments of the present invention are shown in the drawing and will be described in detail in the following description. In the drawings.

DETAILED DESCRIPTION OF PREFERRED EMBODIMENTS

Figure 1A:
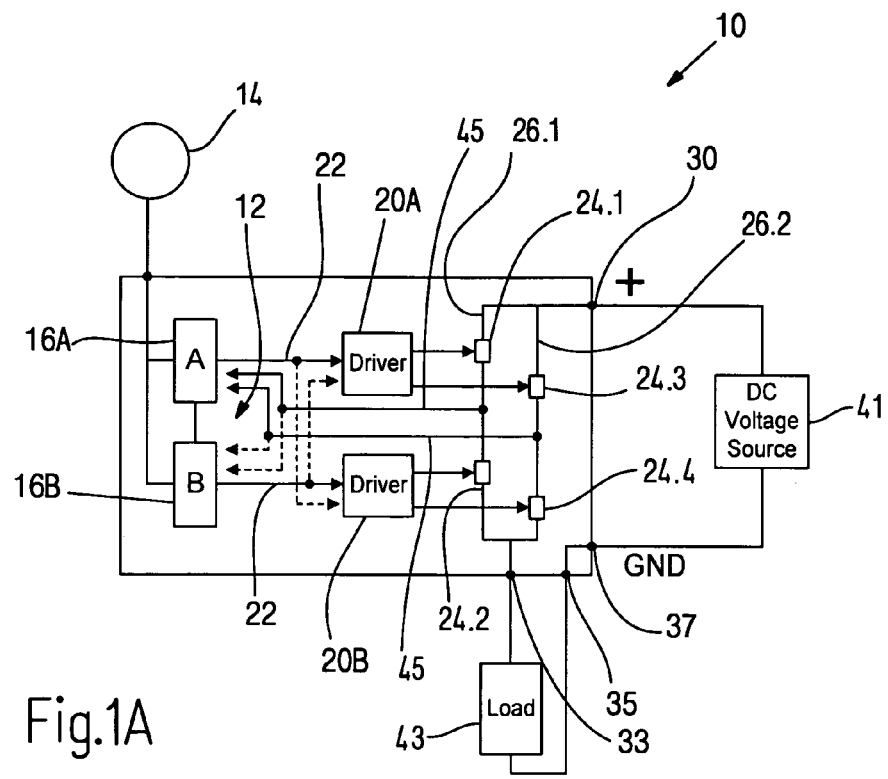
FIG. 1A is a schematic view of a safety switching device according to a first embodiment.

In FIG. 1A, a safety switching device is shown in a schematic presentation and is indicated with reference numeral 10. The safety switching device 10 comprises a schematically indicated safe evaluation and control unit 12. This evaluation and control unit 12 is arranged by using known components, as they are already used in the safety switching device "PNOZ" of the applicant mentioned above. The object of this evaluation and control unit is to evaluate safely the switching signals supplied thereto, for example from an emergency stop push button 14, and to generate respective output signals.

The evaluation and control unit 12 is arranged in the shown embodiment with two channels, both channels being indicated with reference numerals 16a and 16b. Of course, it would also be possible to use other arrangements of the evaluation and control unit 12. For a more detailed description of such an evaluation and control unit 12, reference is made to the book "Maschinensicherheit", Winfried Graf, Huthig-Verlag, 1997.

The safety switching device 10 further comprises a driver device (switching control device) 20A and 20B, respectively, for each channel, each being supplied with a control signal from the respective evaluation and control unit 16a and 16b, respectively, via lines 22. Although in FIG. 1A only one line is shown for the lines 22, the lines 22 may also be provided as multi-core bus lines.

The driver device 20 generates driving signals in response to the supplied control signals of the evaluation and control unit 12, which driving signals are supplied to the switching elements 24.1 to 24.4. In FIG. 1A it is shown that the driver device 20A generates two driving signals which are supplied to both switching elements 24.1 and 24.3. The driver device 20B also generates two driving signals, which are, however, supplied to both switching elements 24.2 and 24.4. Both driving signals generated by the driver devices 20A and 20B, respectively, are equal so that during normal operation of the safety switching device, the switching element pairs 24.1 and 24.3, and 24.2 and 24.4, respectively, have the same switching state.

According to the present invention, the four switching elements 24.1 to 24.4 are all arranged such that two identical current paths 26.1 and 26.2 are formed. Particularly, both switching elements 24.1 and 24.2 are connected in series as to form the first current path 26.1, whereas the other two switching elements 24.3 and 24.4 are also connected in series and form the second current path 26.2. From the diagram in FIG. 1A it is apparent that both current paths 26.1, 26.2 are parallel to each other. Both current paths 26.1, 26.2 couple an input terminal 30 of the safety switching device 10 with an output terminal 33. When the switching elements 24 are switched on, an ohmic connection between the input terminal 30 and the output terminal 33 is provided so that a respective current may flow via both current paths 26.

Beside the output terminal 33, the safety switching device 10 comprises a further output terminal 35 and a further input terminal 37. From FIG. 1A it is apparent that an electrical connection is formed between the input terminal 37 and the output terminal 35.

In operation, a DC voltage source 41 is coupled with both input terminals 30, 37 and provides, for example, a voltage of 24 volt between both terminals 30, 37, the input terminal 30 having a positive potential and the input terminal 37 having a reference potential, for example 0 volt.

The load to be switched by the safety switching device 10 is schematically shown in FIG. 1A and indicated with reference numeral 43. In the present embodiment, it is a high power load, for example a valve block for pneumatic or hydraulic control systems, or an output module of an SPS control system, which requires a current greater than 8 ampere. The load 43 is coupled between the output terminals 33 and 35. As a consequence, there is a current flow from the DC voltage source 41 via the input terminal 30, both current paths 26.1, 26.2, the output terminal 33, the load 43, the output terminal 35 and the input terminal 37 back to the DC voltage source 41 when the switching elements 24 are switched on. If, for example, the emergency stop push button switch 14 is actuated, the evaluation and control unit 12 generates control signals which are converted into respective driving signals by both driver devices 20A, 20B. These driving signals cause the switching elements 24 to switch off as to switch both current paths 26.1, 26.2 currentless. As a result, the load 43 is isolated from the DC voltage source 41.

This kind of safety switching devices 10 requires that the switching-off ability of the switching elements 24 is tested periodically. For this purpose, a signal is picked off between both switching elements 24.1 and 24.2 of the first current path 26.1 and between both switching elements 24.3 and 24.4 of the second current path and is supplied to the evaluation and control unit 12. In FIG. 1A this is shown by means of two arrows indicated with reference numeral 45.

The switching-off ability of the switching elements is now tested by switching-off both switching elements in one current path for a short period, while the switching state of the switching elements in the other current path is maintained. The short switching-off of the switching elements in one current path results in a change of potential between both tested switching elements provided that the switching elements are faultless. The change of potential may be detected by the evaluation and control unit 12 and may be evaluated respectively. In the event that, for example, the switching element 24.1 in the first current path 26.1 cannot be opened any more, the potential remains unchanged during the short test phase, and the evaluation and control unit 12 may detect this as failure. An immediate switching-off of the whole safety switching device and, hence, of the load 43 would be the consequence thereof.

By providing two current paths 26.1, 26.2, only one of which being tested, a constant energy supply of the load 43 also during the test phase is guaranteed. Hence, the safety switching device 10 allows to test the switching-off ability of switching elements although very large currents flow. Moreover, it is not of importance whether the load 43 is a pure ohmic load or, for example, a capacitive load.

FIG. 1A further shows connections in broken lines running from both evaluation and control units 16A, B to the driver devices 20A, B and from the back-readout lines to the evaluation and control units 16A, B. These connections serve to take the two-channel structure of the safety switching device up again; these connections enable each evaluation and control unit 16A, B to drive and to test all four switching elements 24.1–24.4.

Figure 1B:
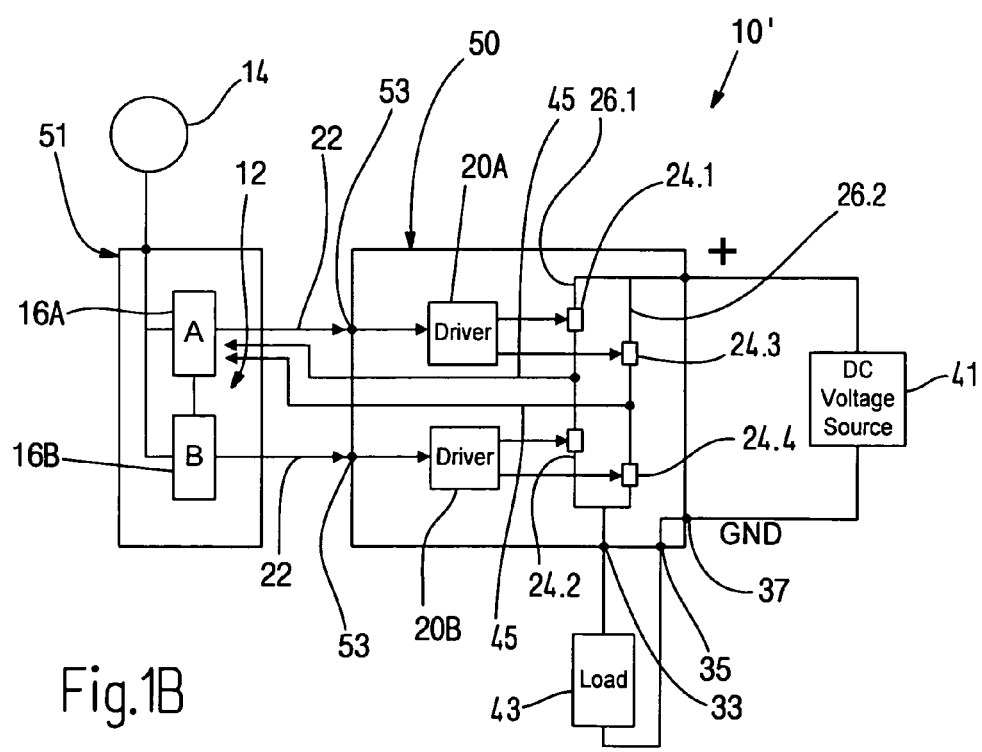
FIG. 1B is a schematic view of a safety switching device according to a second embodiment.

In FIG. 1B, a safety switching device 10' is shown, the function of which is equal to said of the safety switching device 10 already described with reference to FIG. 1A. It is, therefore, refrained from a detailed description thereof at this point. Also the constructive arrangement of the safety switching device 10' does not differ from said of the safety switching device 10. The only difference is that the safety switching device 10' is divided into two modules 50, 51. The module 50 which is indicated as safety switching module in the following comprises the driver devices 20A, 20B as well as the switching elements 24 which are provided in both current paths 26.1, 26.2. The module 51, which is referred to as evaluation and control module in the following, comprises the evaluation and control unit 12, the control signals of which may be supplied to input terminals 53 of the safety switching module 50. By dividing the safety switching device 10' in two single modules 50, 51, the flexibility may be increased. Particularly, the safety switching module 50 may be coupled to already existing safety switching devices as an additional module for switching large currents.

Figure 2:
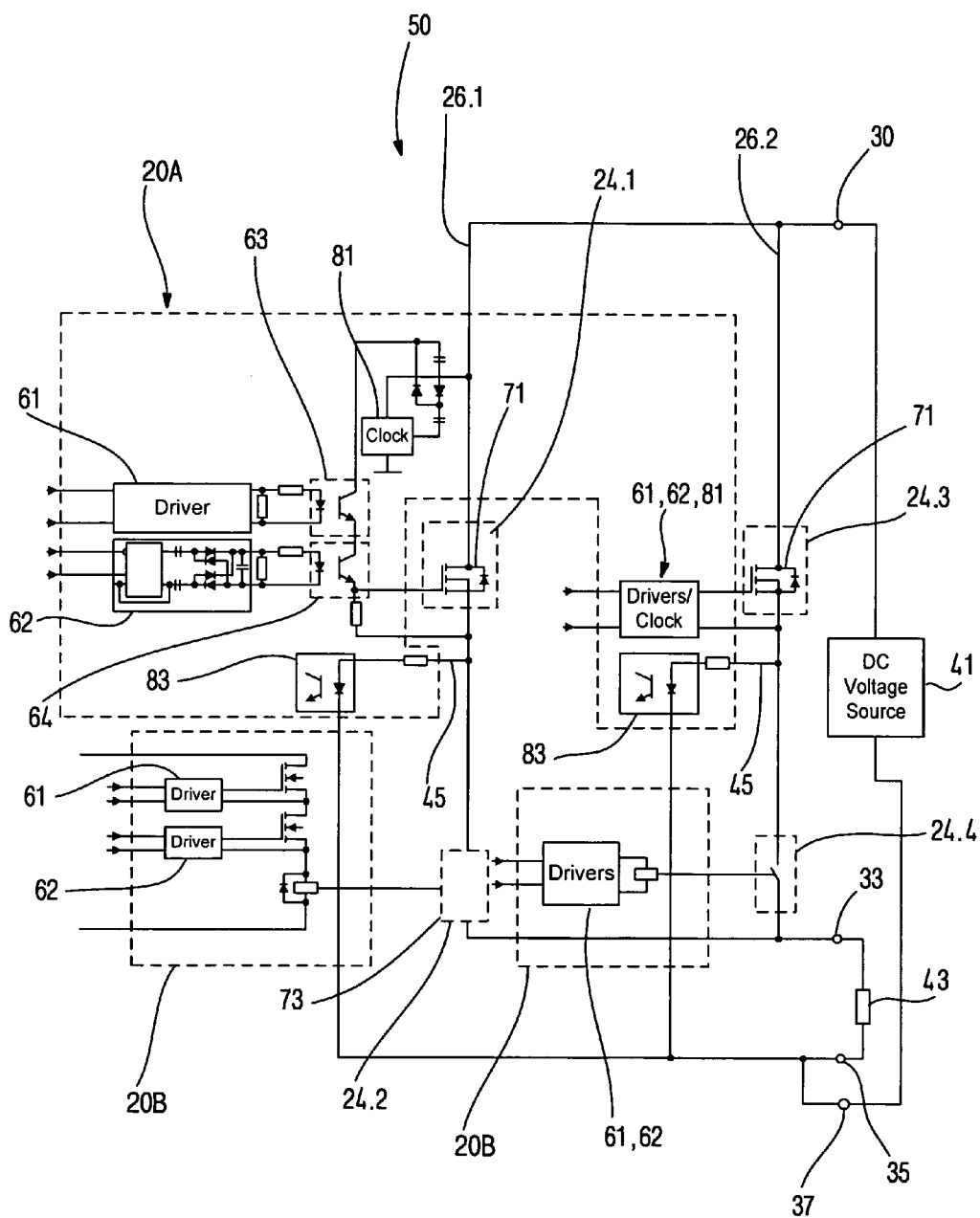
FIG. 2 is a schematic interconnection diagram of the safety switching module according to the present invention in a single-pole implementation.

With reference to FIG. 2 a specific preferred embodiment of the safety switching module 50 will be shown in the following. However, it is to be noted at this point that the circuit arrangement shown is purely illustrative. For achieving the functions described with reference to FIG. 1A, different circuit arrangements are also conceivable.

For the sake of simplification, in FIG. 2 like parts are indicated with like reference numerals, so that it may be refrained from describing these parts again.

The single function blocks, namely both driver devices 20A, 20B as well as the switching elements 24.1 through 24.4, are shown in broken lines.

In the present embodiment, the driver device 20A comprises two driver units 61, 62, each generating an output signal in response to respective input signals, the output signals are supplied to a respective opto-coupler 63 and 64, respectively. The outputs of both opto-couplers 63, 64 are connected in series and serve to drive the switching element 24.1. For this purpose, the control input of the switching element 24.1 is coupled with a positive potential via the outputs of the opto-couplers 63, 64. If respective control signals are supplied to the inputs of both opto-couplers 63, 64, the outputs of both opto-couplers are connected with each other, so that the switching element 24.1 receives a driving signal having positive potential and closes in response thereto. This is the normal operation mode of the safety switching module 50 as to energize the load 43.

In the present embodiment, the switching element 24.1 is a semiconductor switching element, preferably a field effect transistor 71.

In contrast thereto, the second switching element 24.2 in the same current path 26.1 is provided as an electromechanical switching element, preferably a relay 73. This relay 73 is driven by respective driver units 61, 62. Since the relay 73 provides a galvanic isolation to the driver device 20B itself, the use of opto-couplers 63, 64 may be avoided.

In both cases, however, it is to be noted that the activation or drive of the field effect transistor 71 and the relay 73, respectively, is carried out with two channels. Only if both driver units 61, 62 generate a respective driving signal, the switching element 24.1, 24.2 is closed.

The evaluation and control unit 12 tests the switching-off ability of the switching element 24 by briefly switching-off the switching element of the current path.

For testing the switching-off ability of the FET 71 and the contact 73, a signal is picked off between both switching elements 24.1, 24.2 and is supplied via the line 45 to the opto-coupler 83. This opto-coupler 83 generates a back-readout signal, which is supplied to the evaluation and control unit 12. This back-readout signal informs whether the FET 71 and the contact 73 switch off during the test phase. If both switching elements 71 and 73 do this, the safety is guaranteed; if not, the FET 71 or the contact 73 are faulty with the result that the whole safety switching module 50 has to be switched off so that the load 43 is brought into a safe state.

The arrangement of the second current path 26.2 exactly corresponds to that of the current path 26.1, so that it is refrained from a repetition of the description at this point. For the sake of better understanding, some elements are integrated into one function block, for example both driver units 61, 62 and the clock generator 81. Also in the second current path 26.2, the switching-off ability of the FET 71 and the contact 24.2 is carried out by modulating a short switching-off pulse on the driving signal. By means of an optocoupler 83, the respective back-readout signal is generated.

Essential to the realization of the tests of the switching elements is that always only one current path is tested, so that the respective other current path may guarantee a respective uninterrupted energy supply of the load 43 also during the test phase.

In the embodiment shown in FIG. 2, the switching elements of a current path are formed diversitary redundant. Therewith, failures in one current path due to the same reasons may be excluded. Of course, beside this preferred embodiment it is also possible to use also equal switching elements in a current path, particularly semiconductor switching elements or electromechanical switching elements.

Figure 3:
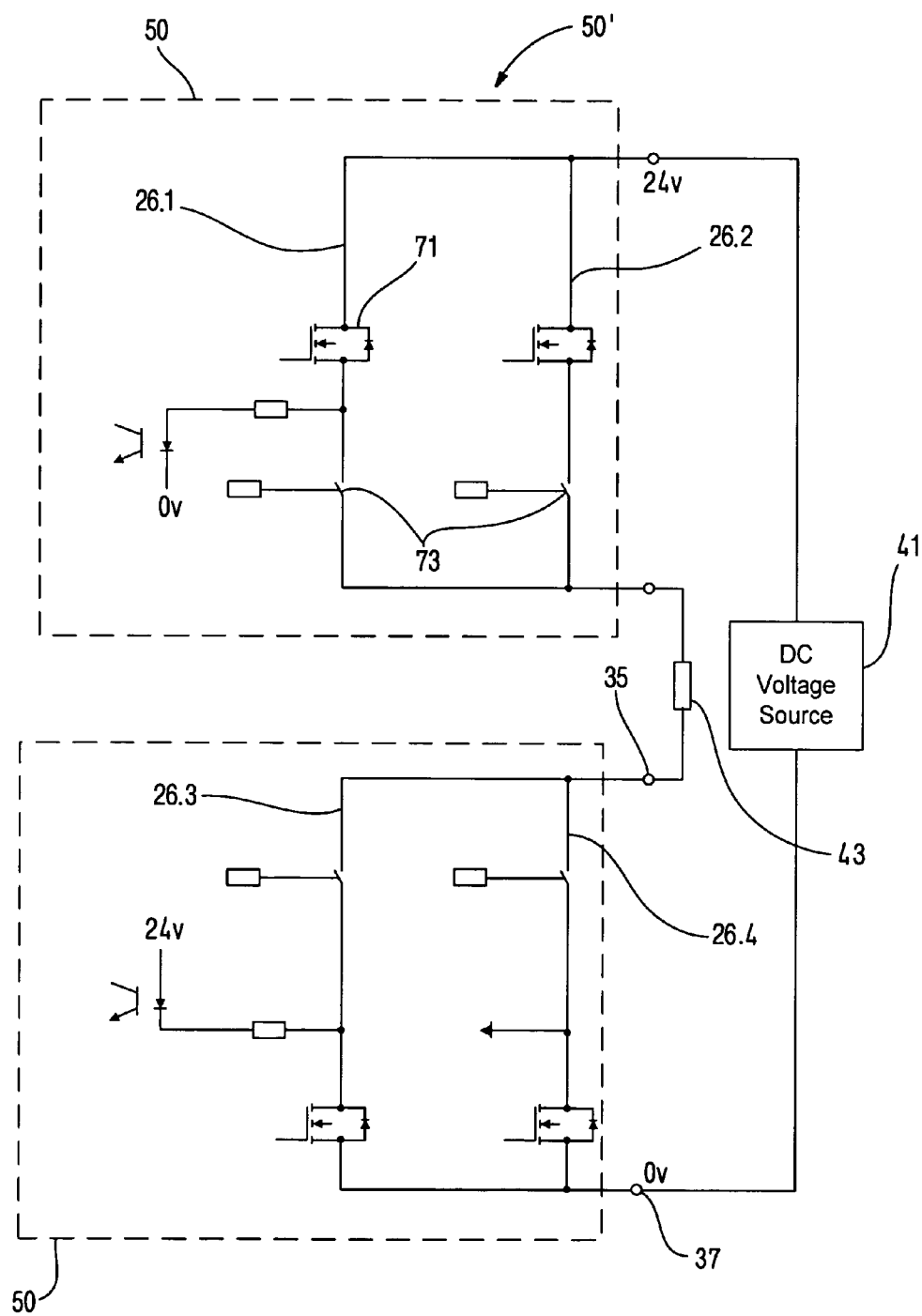
FIG. 3 is a schematic interconnection diagram of the safety switching module according to the present invention in a two-pole implementation.

A further embodiment of a safety switching module is shown in FIG. 3 and indicated with reference numeral 50'. The difference to the safety switching module 50 shown in FIG. 2 is that it is a two-pole embodiment of a safety switching module. I.e. the load 43 lies between two safety switching modules 50, as shown in FIG. 2. The connection between the terminal 35 and the terminal 37 is, hence, not made directly but also via two current paths 26.3 and 26.4, which are structured in a reversed arrangement compared to both current paths 26.1 and 26.2. The function, however, corresponds to that of the safety switching module 50 as shown in FIG. 2 and described with reference thereto, so that it is refrained from describing it again.

The advantage is that the load can be switched-off safely also in the event of a 24 volt short circuit.

To sum up, it is to be noted that the inventive provision of two current paths which are tested alternately may also allow the switching of large currents without having to refrain from a test of the switching-off ability of the switching elements, or without having to provide complicated test circuits which have to be adapted eventually to the respective load.

By means of the inventive circuit arrangement, interruptions of the switching elements are possible which last longer than the switching-off response time of the load. As a result, the test of relays during operation is also possible.

We claim:

1. Safety switching module for safely switching-off an electrical load, comprising:
    a first and a second switching control device;
    a first and a second switching element both being series-connected with each other and forming a first current path for supplying the load, whereby the first switching element can be controlled by the first switching control device and the second switching element can be controlled by the second switching control device;
    an evaluation and control device for testing the switching-off ability of at least one switching element, and
    a third and a fourth switching element which are connected to each other in series, are connected in parallel to the series connection consisting of said first and second switching elements to form a second current path for supplying the load collectively with the first current path during normal operation, the third switching element being controlled by the first switching control device and the fourth switching element being controlled by the second switching control device; wherein
    said evaluation and control device carries out the test of the switching elements alternating in one of both current paths so that the other of both current paths supplies the load.

2. The safety switching module of claim 1, characterized in that said first and said third switching element are provided as semiconductor switching elements.

3. The safety switching module of claim 2, characterized in that said second and said fourth switching element are provided as electromechanical switching elements.

4. The safety switching module of claim 3, wherein said electromechanical switching elements are provided as relays.

5. The safety switching module of claim 1, characterized in that said second and said fourth switching element are provided as electromechanical switching elements.

6. The safety switching module of claim 5, wherein said electromechanical switching elements are provided as relays.

7. The safety switching module of claim 1, characterized in that said switching control devices are provided as a dual-channel switching control device.

8. The safety switching module of claim 1, characterized in that said current paths are coupled with a supply voltage on one side and with the load on the other side.

9. The safety switching module of claim 1, characterized in that the evaluation and control device is coupled with each of both current paths between said first and second switching elements and said third and fourth switching elements, respectively.

10. The safety switching module of claim 9, characterized in that said switching-off pulse is modulated on said signal of the switching control device.

11. The safety switching module of claim 1, characterized in that said evaluation and control device generates a short switching-off pulse and supplies the pulse either said first and second switching elements or said third and fourth switching elements in order to switch them off shortly.

12. The safety switching module of claim 1, characterized in that said switching elements are provided as electromechanical switching elements.

13. The safety switching module of claim 12, wherein said electromechanical switching elements are provided as relays.

14. The safety switching module of claim 1, characterized in that said switching elements are provided as semiconductor switching elements.

15. Method for testing the switching-off ability of a switching element in a safety switching module which serves to safely switch-off an electric load, comprising the steps:
    providing a first current path for energizing the load, said first current path comprising at least one switching element for safely switching-off;
    providing a second current path in parallel to the first current path, for energizing the load collectively with the first current path during normal operation, the second current path comprising at least one switching element;

alternately testing the switching-off ability of one of both current paths, the other current path not being tested solely energizing said load during this test phase.

16. Method for testing the switching-off ability of a switching element in a safety switching module which serves to safely switch-off an electric load, comprising the steps:
- providing a first current path for energizing the load, said first current path comprising a first and a second switching element for safely switching-off, both switching elements being connected in series;
- providing a second current path in parallel to the first current path, for energizing the load collectively with the first current path during normal operation, the second current path comprising a third and a fourth switching element, both switching elements being connected in series;
- driving the first and third switching elements by a first switching control device;
- driving the second and fourth switching elements by a second switching control device; and
- alternately testing the switching-off ability of one of both current paths, the other current path not being tested solely energizing said load during this test phase.

17. Safety switching module for safely switching-off an electrical load, comprising:
- a first switching control device;
- a first current path for supplying the load, said first current path comprising a first switching element, whereby the first switching element can be controlled by the first switching control device;
- an evaluation and control device for testing the switching-off ability of the first switching element; and
- a second current path connected in parallel to the first current path for supplying the load collectively with the first current path during normal operation, said second current path comprising a second switching element being controlled by the first switching control device; wherein
- said evaluation and control device carries out the test of the switching elements alternating in one of both current paths so that the other of both current paths supplies the load.

* * * * *